(12) United States Patent
Aoki

(10) Patent No.: US 10,600,899 B2
(45) Date of Patent: Mar. 24, 2020

(54) SEMICONDUCTOR DEVICE

(71) Applicant: Sanken Electric Co., Ltd., Saitama (JP)

(72) Inventor: Hironori Aoki, Saitama (JP)

(73) Assignee: Sanken Electric Co., Ltd., Saitama (JP)

(*) Notice: Subject to any disclaimer, the term of this patent is extended or adjusted under 35 U.S.C. 154(b) by 0 days.

(21) Appl. No.: 16/114,806

(22) Filed: Aug. 28, 2018

(65) Prior Publication Data

US 2020/0027975 A1   Jan. 23, 2020

(30) Foreign Application Priority Data

Jul. 18, 2018 (JP) ................. 2018-135135

(51) Int. Cl.
| | |
|---|---|
| *H01L 29/778* | (2006.01) |
| *H01L 29/20* | (2006.01) |
| *H01L 21/02* | (2006.01) |
| *H01L 21/8232* | (2006.01) |
| *H01L 29/51* | (2006.01) |
| *H01L 23/488* | (2006.01) |

(52) U.S. Cl.
CPC ...... *H01L 29/778* (2013.01); *H01L 21/02118* (2013.01); *H01L 21/8232* (2013.01); *H01L 29/2003* (2013.01); *H01L 29/518* (2013.01)

(58) Field of Classification Search
CPC . H01L 29/778; H01L 29/518; H01L 21/8232; H01L 29/2003; H01L 21/02118
See application file for complete search history.

(56) References Cited

U.S. PATENT DOCUMENTS

| 10,020,373 | B1* | 7/2018 | Kumakura | ........ H01L 23/53295 |
| 2008/0283933 | A1* | 11/2008 | JangJian | ........... H01L 21/02129 257/384 |
| 2009/0149016 | A1* | 6/2009 | Hwang et al. | ................. 438/614 |
| 2009/0206479 | A1* | 8/2009 | Daubenspeck | ....... H01L 23/488 257/738 |
| 2011/0227083 | A1* | 9/2011 | Tanabe | .............. G02F 1/136213 257/59 |
| 2014/0353724 | A1* | 12/2014 | Fujita | ................ H01L 21/02518 257/195 |

FOREIGN PATENT DOCUMENTS

JP    2017-041616 A    2/2017

* cited by examiner

Primary Examiner — Marcos D. Pizarro
Assistant Examiner — Sue Tang
(74) *Attorney, Agent, or Firm* — Hawaii Patent Services; Nathaniel K. Fedde

(57) ABSTRACT

Provided is a low cost semiconductor device in which occurrence of chipping and a crack during dicing is suppressed. A nitride layer (silicon nitride layer) 23 is formed on an oxide layer 22. In FIG. 1, a thick organic layer 24 is formed as a top layer. The semiconductor device 1 is characterized by its structure on a side of its end portion. In FIG. 1, the end portion E of the semiconductor device 1 is formed by cutting with a blade in the vertical direction during dicing. An edge E1 of both the oxide layer 22 and the nitride layer is located apart from an edge of a semiconductor substrate 10. An edge E2 of the organic layer 24 on the nitride layer 23 is located inside the edge E1 of the nitride layer 23 (on a side more distant from the edge E).

9 Claims, 7 Drawing Sheets

SEMICONDUCTOR DEVICE

INCORPORATION BY REFERENCE

This application is based on and claims the benefit of priority from Japanese Patent Application No. 2018-135135 filed on Jul. 18, 2018, the entire contents of which are hereby incorporated by reference.

BACKGROUND

The present invention relates to a structure of a semiconductor device which is obtained by forming it in large numbers on a semiconductor wafer and subsequent dicing and separation.

It is general that, when fabricating a semiconductor device (various kinds of transistors and various kinds of diodes), a large number of individual semiconductor dies are formed in array on a large semiconductor wafer (semiconductor substrate) and, by finally cutting scribe lines existing between the semiconductor dies (dicing the semiconductor wafer), the semiconductor dies are obtained as individually separated ones. The dicing is generally performed using a disk-shaped dicing blade in rotation, which intersects with the semiconductor wafer. At that time, there may occur chipping at an end portion (on a side having been in contact with the dicing blade) within the diced and separated semiconductor die. The chipping is caused by a crack generated in the semiconductor wafer during the dicing. In the semiconductor die, an area to perform actual electrical operation (operation area) is located apart from the end portion, but chipping exerts malfunction on the operation and reliability when it becomes large. Wide bandgap group-III nitride compound semiconductors are widely used as materials for power semiconductor devices and light emitting devices, but it is general that a crack occurs more easily in the group-III nitride compound semiconductors represented by GaN than in silicon and the like, during their processing, and accordingly, chipping occurs easily particularly in the group-III nitride compound semiconductors.

The malfunction such as chipping and cracking can be reduced by locating the operation area sufficiently apart from an end portion cut in the above-described way, in the semiconductor die. However, in that case, a practical area of individual semiconductor die is increased, accordingly the number of semiconductor dies obtained from one semiconductor wafer is reduced, and therefore cost reduction of the semiconductor dies is difficult.

In view of the above-described situation, it is described in JP-2017-41616 (A) that, by removing, at the side of an edge in individual semiconductor dies (semiconductor devices), an oxide layer (silicon oxide layer) formed on the surface, and making an end portion of the oxide layer have a tapered shape (bevel-cut shape), chipping occurrence and crack development toward the semiconductor die side can be suppressed. In that case, the bevel-cut shape of the oxide layer can be formed by mechanical processing and the like.

In the technology described in JP-2017-41616 (A), the bevel-cut shape is formed over the entire periphery of the semiconductor die, but it takes long time to perform such mechanical processing precisely over the entire periphery in every semiconductor die. Further, in the technology, the mechanical processing needs to be performed only on an edge of the oxide layer but, if the semiconductor substrate is damaged in the processing, malfunction on electrical characteristics and reliability of semiconductor dies is generated.

For these reasons, it has been difficult to achieve, by the technology described in JP-2017-41616 (A), a low cost semiconductor device in which occurrence of chipping and a crack during dicing is suppressed.

The present invention has been made in view of the above-described issue, and accordingly is aimed at providing an invention to resolve the issue.

SUMMARY

To resolve the above-described issue, the present invention is configured as follows.

A semiconductor device of the present invention is a semiconductor device having a protective layer formed on a semiconductor substrate, the protective layer including a silicon nitride layer and an organic film layer in its stack structure, wherein the organic film layer is formed on the silicon nitride layer, with a larger thickness than that of the silicon nitride layer, and the organic film layer is formed such that, in a plan view, an end portion of the organic film layer is located inside an area where the silicon nitride layer is formed, on the semiconductor substrate.

In the semiconductor device of the present invention, the distance between the edge of the organic film layer and an edge of the silicon nitride layer is set to be no smaller than 10 μm and no larger than 200 μm, in a plan view.

In the semiconductor device of the present invention, the silicon nitride layer is formed such that, in a plan view, the edge of the silicon nitride layer is located inside an edge of the semiconductor substrate, and, the distance between the edge of the silicon nitride layer and the edge of the semiconductor substrate is set to be no smaller than 50 μm and no larger than 200 μm, in a plan view.

In the semiconductor device of the present invention, an oxide layer is formed on the semiconductor substrate, and the silicon nitride layer is formed on the silicon oxide layer.

In the semiconductor device of the present invention, a TEOS oxide layer is formed on the semiconductor substrate, and the silicon nitride layer is formed on the TEOS oxide layer.

In the semiconductor device of the present invention, on a side which is opposite, with reference to the edge of the silicon nitride layer in a plan view, to a side where the edge of the semiconductor substrate is located, a trench which extends along the edge of the silicon nitride layer and is dug down from the top surface of the semiconductor substrate is formed in the semiconductor substrate.

In the semiconductor device of the present invention, the trench is formed as a plurality of trenches in a row extending from the side of the edge of the silicon nitride layer in a direction toward a side opposite to the side where the edge of the semiconductor substrate is located.

In the semiconductor device of the present invention, the trenches are formed to be smaller in both width and depth with increasing distance from the edge of the silicon nitride layer in the direction toward the side opposite to the side where the edge of the semiconductor substrate is located.

In the semiconductor device of the present invention, the organic film layer is composed of polyimide.

In the semiconductor device of the present invention, the semiconductor substrate includes a stack structure including a layer composed of a group-III nitride semiconductor.

DETAILED DESCRIPTION

Hereinafter, a semiconductor device corresponding to an exemplary embodiment of the present invention will be described. In the semiconductor device, a semiconductor element (HEMT: High Electron Mobility Transistor) is formed using a semiconductor substrate including a layer composed of a group-III nitride compound semiconductor (GaN) as its top portion, and a protective layer including at least a silicon nitride layer and a thick organic film layer (polyimide layer) in its stack structure is formed at the top of the semiconductor device.

Figure 1:
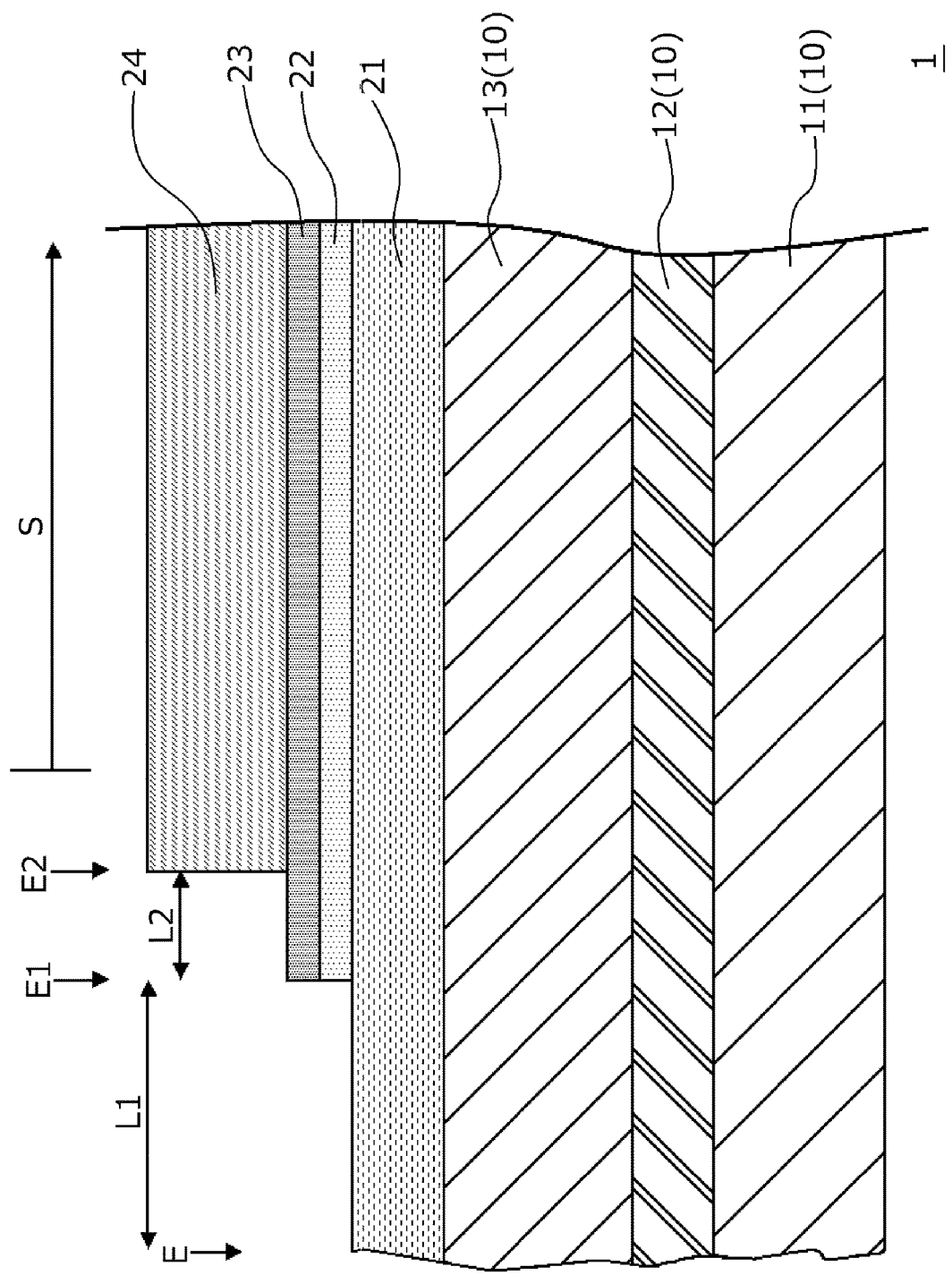
FIG. 1 is a cross-sectional view showing a structure of a semiconductor device according to an exemplary embodiment of the present invention.

FIG. 1 is a cross-sectional view showing a structure of the semiconductor device 1. In a semiconductor substrate 10 used there, on a silicon substrate 11 composed of a silicon single crystal, a GaN layer 13 is formed by epitaxial growth with a buffer layer 12 intervening between it and the silicon substrate 11. In an operation area S in FIG. 1, a HEMT including a source electrode, a drain electrode, a gate electrode and the like is formed, but illustration of its structure is omitted there because the structure is similar to an already known one and is not related to an essential of the present invention.

On the top surface of the semiconductor substrate 10 (GaN layer 13), a TEOS oxide layer 21 to be an interlayer insulating layer in the HEMT is formed. The TEOS oxide layer 21 is an oxide layer formed using TEOS (Tetra ethoxy silane), which is liquid at room temperature, as a source and using, for example, plasma CVD or the like. The TEOS oxide layer 21 is provided with different characteristics from that of an ordinary silicon oxide layer formed using silane (SiH$_4$) as a source, such as that it can be formed with a larger thickness and a higher step coverage compared to the silicon oxide layer. Because the TEOS oxide layer 21 is an interlayer insulating layer, as described above, wirings or the like are arranged within it in the actual device, but illustration of the configuration is omitted in FIG. 1.

On the TEOS oxide layer 21, a stack structure to constitute a protective layer in the semiconductor device 1 is provided. The protective layer is provided for securing insulating and moisture-resistant properties and the like of the surface and for mechanical protection of the surface, in the semiconductor device 1. In the present case, first, on the TEOS oxide layer 21, an oxide layer (silicon oxide layer) 22 is formed using silane as a source and using, for example, plasma CVD or the like. The oxide layer 22 has a composition SiOx which is close to SiO$_2$, where a value of x differs depending on growth conditions and the like. The oxide layer 22 has an excellent insulating property but also has high moisture permeability, and it accordingly is difficult to secure high moisture resistivity using the oxide layer 22.

On the oxide layer 22, a nitride layer (silicon nitride layer) 23 is formed. The nitride layer 23 is formed, for example, by plasma CVD using silane and ammonia or the like as sources. The nitride layer 23 has a composition SiNy which is close to SiN$_4$, where a value of y differs depending on growth conditions and the like. The nitride layer 23 has a denser structure compared to the oxide layer 22 and the TEOS oxide layer 21 and accordingly has low moisture permeability, and it accordingly is possible to secure high moisture resistivity using the nitride layer 23. On the other hand, because forming the nitride layer 23 with a large thickness is difficult, it is difficult to secure insulating property and mechanical strength by means of only the nitride layer 23, and accordingly the above-described stack structure combining the nitride layer 23 with the oxide layer 22 is employed.

Even the entire thickness of the above-described stack structure combining the oxide layer 22 and the nitride layer 23 is not sufficient for securing mechanical strength in the semiconductor device 1. Accordingly, in FIG. 1, a thick organic film layer 24 is formed as a top layer. The organic film layer 24 is composed of polyimide, for example, and can be formed with a large thickness using, for example, a spin-coating method or the like, which is a different growth method from that used for the oxide layer 22 and the nitride layer 23. Further, patterning of the organic film layer 24 can be easily performed when it is composed of photo-sensitive polyimide, for example, by performing exposure using a mask and subsequent developing.

Here, the semiconductor device 1 is characterized by its structure on a side of its edge. In FIG. 1, an edge E of the semiconductor device 1 (semiconductor substrate 10) is formed by cutting with a blade in the vertical direction during dicing. At that time, while the TEOS oxide layer 21 has been formed over the entire surface of the semiconductor substrate 10, the oxide layer 22 and the nitride layer 23 located on and above the TEOS oxide layer 21 have been removed on the side of the edge E, and accordingly an edge E1 of both the oxide layer 22 and the nitride layer 23 is located apart from the edge E of the semiconductor substrate 10, that is, L1>0 is assumed in FIG. 1. Further, an edge E2 of the organic film layer 24 on the nitride layer 23 is located inside the edge E1 of both the oxide layer 22 and the nitride layer 23 (on a side more distant from the end portion E), that is, L2>0 is assumed in FIG. 1.

Figure 2:
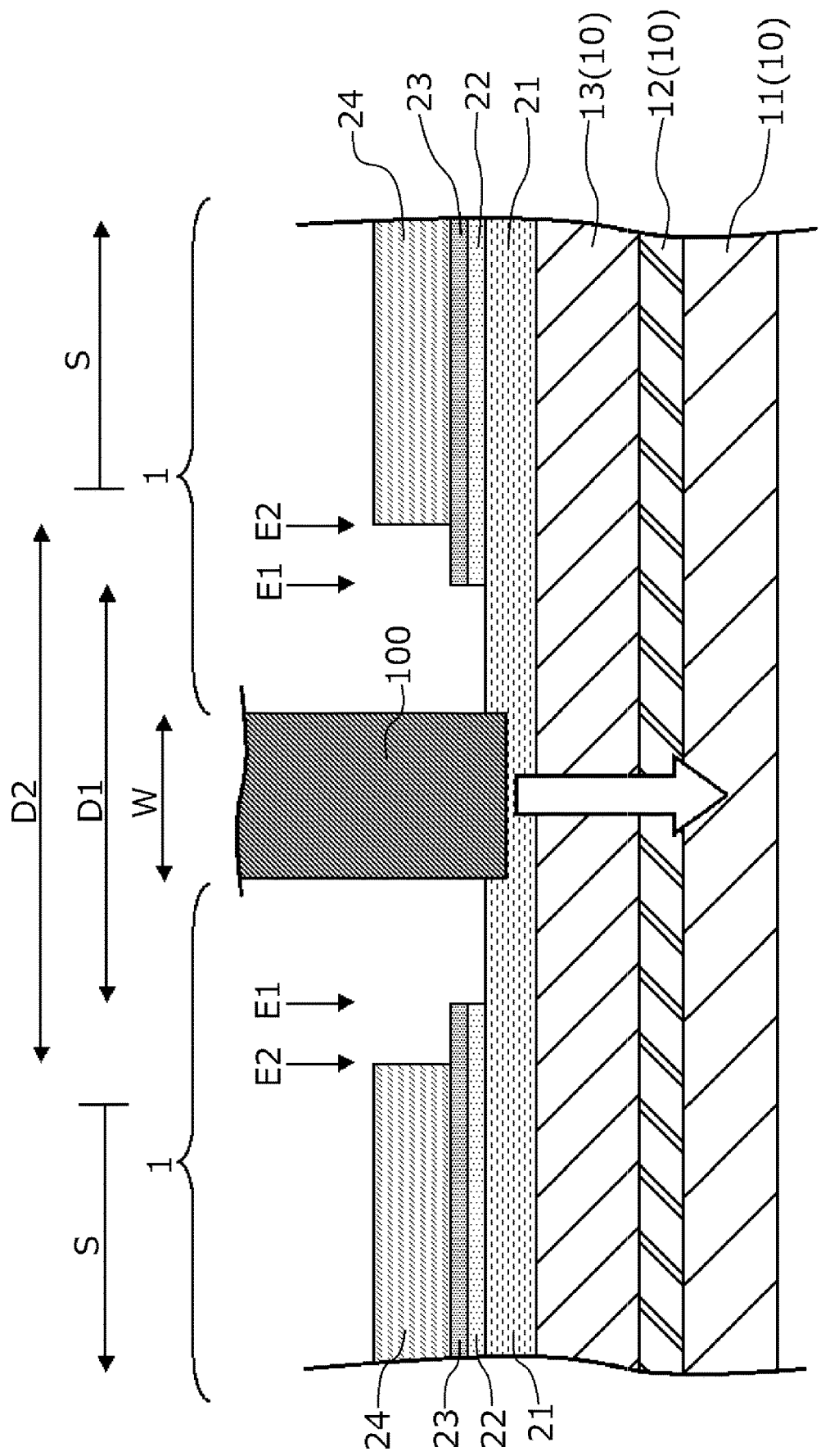
FIG. 2 is a cross-sectional view showing a state during dicing in fabrication of the semiconductor device according to the exemplary embodiment of the present invention.

FIG. 2 is a diagram showing a state where dicing is performed in fabrication of the semiconductor device 1. The diagram shows a state where two semiconductor devices 1 neighboring with each other in the horizontal direction have been formed using a large semiconductor wafer (semiconductor substrate 10) and the semiconductor wafer is being cut at the scribe lines existing between the two devices in the thickness direction by a dicing blade 100. In accordance with the shape illustrated in FIG. 1, the TEOS oxide layer 21 on the semiconductor substrate 10 is formed over the entire surface of the semiconductor substrate 10. In contrast, the oxide layer 22 and the nitride layer 23 each have been formed into two sections which are separated, by an interval D1 wider than a width W of the dicing blade 100, across a position (scribe line) between the dies (the semiconductor devices 1 on the left and right sides) at which the dicing blade is in contact with the semiconductor wafer. A gap corresponding to the distance D1 in both the oxide layer 22 and the nitride layer 23 is formed by dry etching, for example.

Further, the organic film layer 24 has been formed into two sections which are separated, by an distance D2 wider than D1, across the scribe line. A gap corresponding to the distance D2 in the organic film layer 24 can be formed, for example, by performing exposure using a mask and developing of the organic layer 24 when it is composed of photo-sensitive polyimide.

Figure 3:
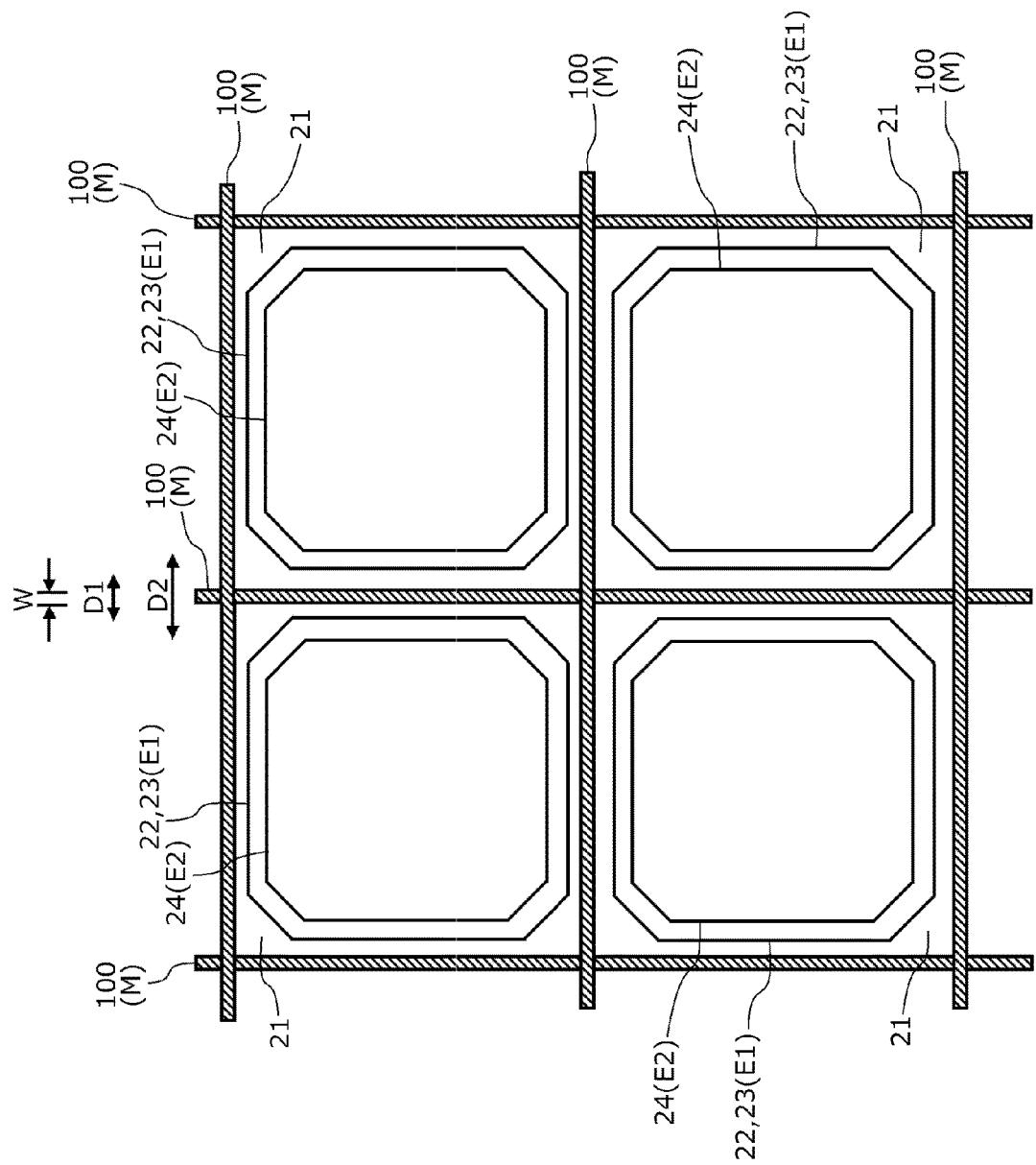
FIG. 3 is a cross-sectional view showing a state during dicing in fabrication of the semiconductor device according to the exemplary embodiment of the present invention.

FIG. 3 schematically shows a top view of an area where two semiconductor dies (semiconductor devices 1) are arranged in a row in each of horizontal and vertical directions in a plan view. There, three scribe lines M (dicing blades 100) are arranged along each of the horizontal and vertical directions. In FIG. 3, W, D1 and D2 are illustrated with magnification, but their actual differences from each other are smaller. Further, while, in actual dicing, cutting is performed at one position at each time using one dicing blade 100, the dicing blade 100 is illustrated at each and every cutting position simultaneously in the diagram, for convenience.

Figure 4A:
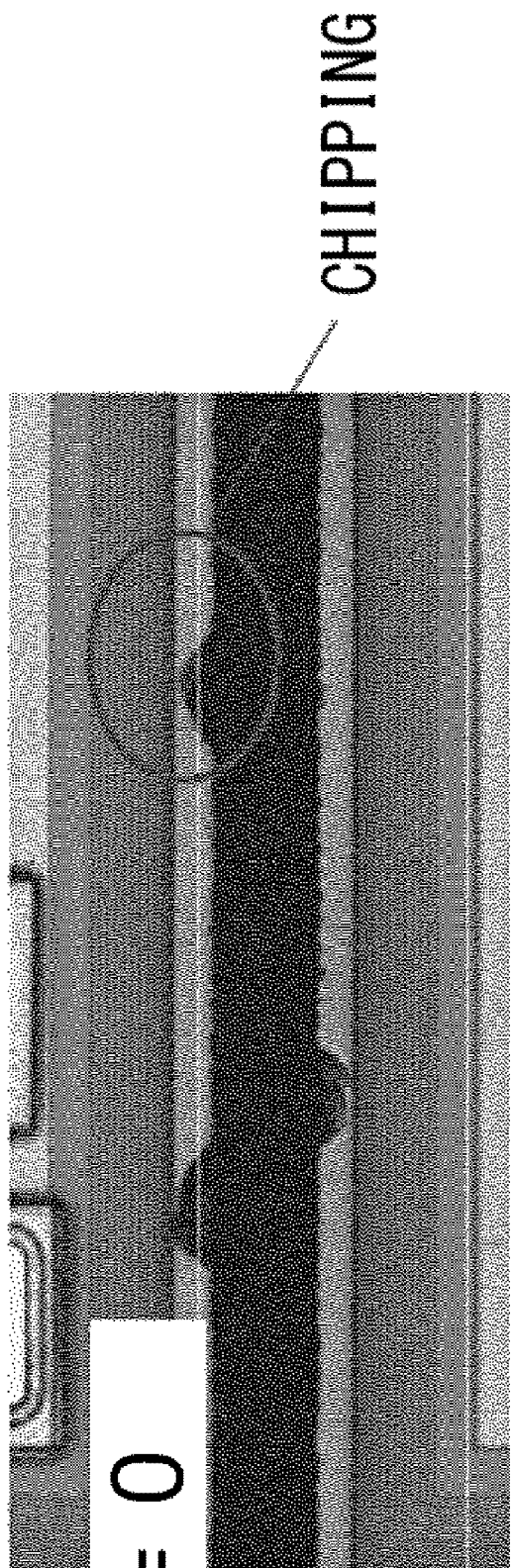
FIG. 4A is an external view photograph, after dicing, of a comparison example of the semiconductor device according to the exemplary embodiment of the present invention.
Figure 4B:
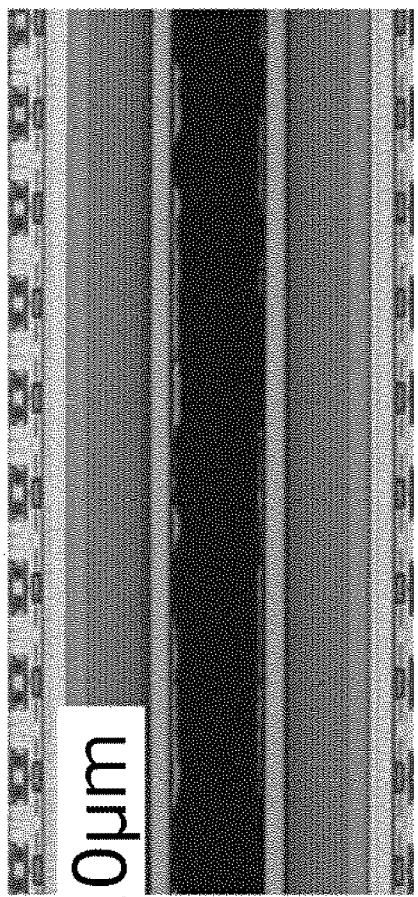
FIG. 4B is an external view photograph, after dicing, of an implementation example of the semiconductor device according to the exemplary embodiment of the present invention.

By configuring as described above, it is possible to suppress chipping occurrence in the semiconductor device 1 having been diced by the dicing blade 100. FIG. 4A is an external view photograph of the semiconductor device 1 near its edge after dicing, in a case of using the already-described semiconductor substrate 10 composed of the silicon substrate 11, the buffer layer 12 and the GaN layer 13 and setting in FIG. 1 as L1=50 μm and L2=0 (D1=D2 in FIG. 2), and FIG. 4B is that in a case of using a similar semiconductor substrate 10, setting W and D1 as the same as in the case of FIG. 4A, but setting as L2=10 μm (D2>D1). In the case of FIG. 4B with the setting of L2=10 μm, chipping occurrence appearing in the case of FIG. 4A is suppressed.

A cause of the result is estimated to be associated with easiness of crack development around the edge E of the semiconductor substrate 10. It is considered first that the crack development becomes difficult as a result of forming the nitride layer 23 having a high mechanical strength and a high Young's modulus on the semiconductor substrate 10, because the semiconductor substrate 10 is reinforced by the formation of the nitride layer 23. However, because internal stress of the nitride layer 23 is large and, accordingly, internal stress in the semiconductor substrate 10 abruptly varies particularly at the edge E1 of the nitride layer 23, crack occurrence becomes relatively easy at the edge E, or the effect of crack suppression by the nitride layer 23 becomes insufficient. In that case, by locating the edge E2 of the thick organic film layer 24 more distant than the edge E1 of the nitride layer 23 from the edge E of the semiconductor substrate 10, variation of internal stress in the semiconductor substrate 10 can be made gradual. Thereby, the crack development, and accordingly chipping, can be suppressed. For this reason, it is preferable to set as L2≥10 μm, and particularly as L2≥20 μm, in FIG. 1. Further, to reduce influence of a crack on the operation area S, it is preferable to set as L1≥50 μm, particularly L1≥70 μm, or as L1=L2≥90 μm. However, the operation area needs to have a certain amount of area in accordance with characteristics required of it, and therefore, if L1 and L2 are too large, the chip area increases practically, accordingly the number of semiconductor chips obtained from one wafer is reduced, and the fabrication cost becomes high. For this reason, it is preferable to set as L1≤200 μm (particularly L1≤150 μm) and L2≤200 μm (particularly L2≤150 μm), or as L1+L2≤300 μm.

It is generally expected that it is preferable that the organic film layer 24, which is formed as the top layer and is thickest, covers a broad area of the surface of the semiconductor substrate 10, from the viewpoint of mechanical protection of a semiconductor device. However, in the above-described configuration, chipping and cracking are suppressed by limiting an area of the surface of the semiconductor substrate 10 covered by the nitride layer 23 and also limiting an area of the surface of the nitride layer 23 covered by the organic layer 24.

In fabricating the semiconductor device 1 described above, dicing using the dicing blade 100 is not different from that performed in fabricating conventional semiconductor devices, and a significant feature of the above-described semiconductor device 1 is the positional relationship between the edge E1 of the nitride layer 23 and the edge E2 of the organic layer 24. Here, patterning of the nitride layer 23/oxide layer 22 and that of the organic layer 24 are generally performed also in conventional semiconductor devices for exposing bonding pads and the like, and there is a difference between the present and conventional semiconductor devices in only a pattern used when performing each of the patternings (a pattern of a mask used in exposure). Therefore, compared to conventional semiconductor devices, there is no increase in fabrication cost when fabricating the above-described semiconductor device 1, and the semiconductor device 1 can be obtained at low cost. In the present semiconductor device 1, chipping occurrence is suppressed also in the fabrication, and the chip yield accordingly is improved. As a result, the semiconductor device 1 can be obtained at particularly low cost.

Figure 5:
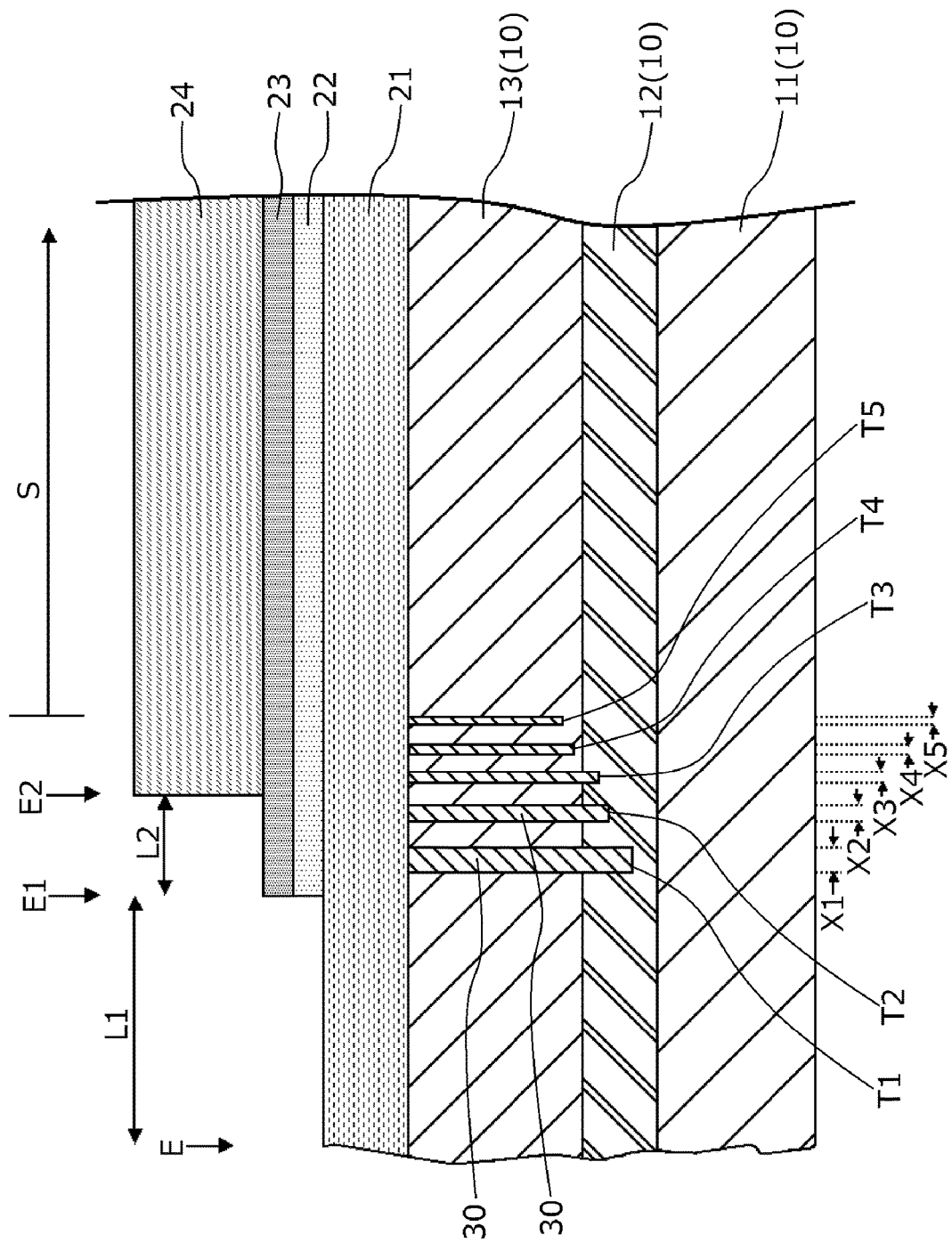
FIG. 5 is a cross-sectional view showing a structure of a modified example of the semiconductor device according to the exemplary embodiment of the present invention.
Figure 6:
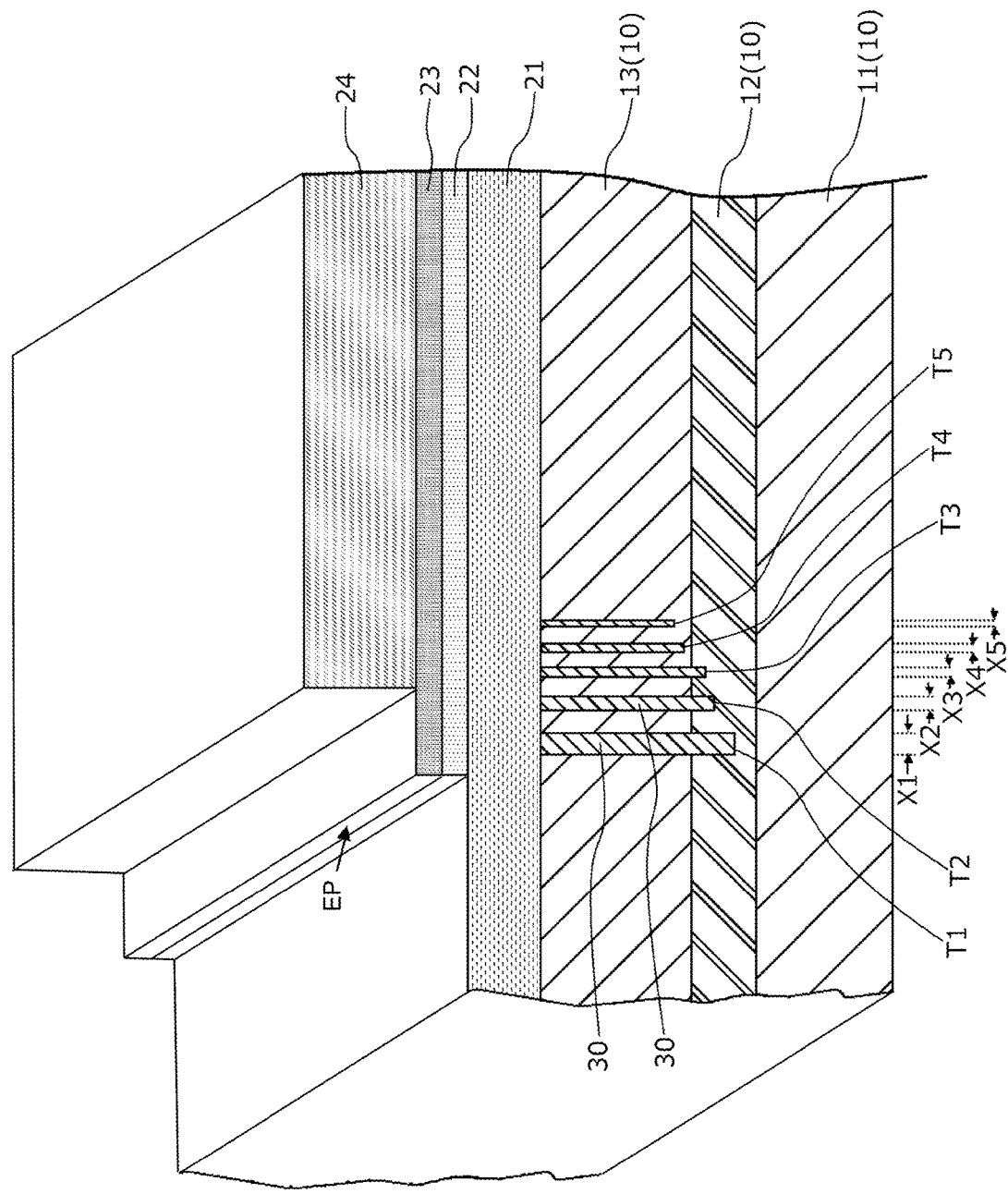
FIG. 6 is a perspective cross-sectional view of the modified example shown in FIG. 5, and showing end portion EP.

In the above-described semiconductor device 1, by devising a configuration around a periphery portion of the semiconductor substrate 10, malfunctions such as crack on the device or crack occurrence itself can be further suppressed. FIG. 5 is a diagram showing a structure of such a semiconductor device 1 in correspondence with FIG. 1. In the semiconductor device 2, a stack configuration in the semiconductor substrate 10 and a configuration concerning an interlayer insulating layer and a protective layer on the semiconductor substrate 10 are similar to those in the semiconductor device 1 described earlier. The present semiconductor device 2 is different in that a plurality of trenches are formed within the semiconductor substrate 10 on the side of an edge E (edge E1). In FIG. 5, trenches T1 to T5 are formed in this order from the left to the right in the diagram. Each of the trenches T1 to T5 is formed along the edge E1 and accordingly is formed with its shape in a plan view being concentric with and similar to the edge E1 and E2 in FIG. 3, and the trench T1 is located most outside, and the trench T5 most inside. An operation area S to electrically function practically in the semiconductor device 2 is located inside the trench T5.

The trenches T1 to T5 are formed by performing, on the semiconductor substrate 10, photolithography (photoresist coating, exposure and developing) using a mask provided with openings corresponding respectively to the trenches T1 to T5 and subsequent dry etching. After that, by forming a silicon oxide layer similar to the oxide layer 22 with a larger thickness of a level to fill the trenches T1 to T5 and subsequently removing the silicon oxide layer grown on the top surface of the semiconductor substrate 10, it is possible to make the silicon oxide layer remain only inside the trenches T1 to T5 as buried oxide layers 30. Subsequent formation of the TEOS oxide layer 21, the oxide layer 22, the nitride layer 23 and the organic film layer 24 and patterning of the nitride layer 23/oxide layer 22 and the organic film layer 24 are similar to those in the semiconductor device 1 described earlier.

In the present case, when a crack occurs in the semiconductor substrate 10 from the side of the edge E, the crack may develop from the edge side of the semiconductor substrate 10 to the most outside trench T1, but the existence of the trench T1 prevents the crack from developing further inside (to the right in the diagram). However, when the trench T1 thus exits, an internal stress in the semiconductor substrate 10 abruptly varies around the trench T1, and there accordingly may be created a state where a crack easily occurs in the semiconductor substrate 10 at the portion around the trench T1, similarly to the case described earlier where the existence of the nitride layer 23 is concerned. In view of this, the trenches T2 to T5 are provided in the configuration in FIG. 5, where depths of the respective trenches T1 to T5 from the surface are set to be gradually smaller for trenches located more inside (more right in the diagram) so that influences of the respective trenches on the internal stress in the semiconductor substrate 10 be gradually smaller along the direction toward the inside.

Here, the trenches T1 to T5 are simultaneously formed by dry etching, and their opening widths X1 to X5 are set to satisfy X1>X2>X3>X4>X5. The opening widths X1 to X5 can be set as opening widths in a mask. Here, as illustrated in the diagram, a trench depth/opening width (aspect ratio) is set to be substantially larger than 1 for every one of the trenches. When forming a trench with such a large aspect ratio, the etching rate in the bottom region decreases more with decreasing opening width of the trench, because a situation of reactive gas supply toward the bottom region of the trench in the dry etching differs depending on the opening width. Accordingly, even when the trenches T1 to T5 are simultaneously etched, it is possible to form the trench T1 to be deepest and the trench T5 to be shallowest, in accordance with the opening widths described above. The trenches T1 to T5 are provided for suppressing abrupt variation of internal stress in the semiconductor substrate 10, and they have completely no effect on electrical operation of the semiconductor device 2. Therefore, required accuracy is not so high for absolute values of the depths of the trenches T1 to T5.

Accordingly, the above-described structure associated with the trenches T1 to T5, including the buried oxide layers 30 inside them, can be easily formed. While it is assumed in the above-described example that the buried oxide layers 30 are provided in the respective trenches, a similar effect can be obtained also by using other structures such as that of filling a trench with a conductive layer and that of filling a trench with a conductive layer after forming an oxide layer on the inner surface of the trench. Further, while the five trenches T1 to T5 are used in the above-described example, the number of trenches may be appropriately set at any value.

In a particular case where a power semiconductor element is formed in the operation area S and an electric field in the semiconductor substrate 10 (GaN layer 13) becomes high in operation, a trench particularly for relaxing the electric field in a periphery region sometimes is provided as a guard ring. In that case, such a guard ring may be used also as the trenches T1 to T5. While, in the example in FIG. 5, each of the trenches is formed to have a rectangular cross-section (a cross-section shape with the trench's inner side wall extending along the vertical direction), the cross-section may be of a tapered-shape with the trench's inner diameter being smaller at lower vertical positions. Such a shape can be determined by dry etching conditions. Further, intervals of the trenches in the horizontal direction in FIG. 5 are not necessarily required to be constant, but the intervals may be appropriately set at any value. For example, they may be set such that those located more inside be larger, in order to reduce variation of the internal stress. It is assumed in the above-described semiconductor device 2 that the trenches are formed to surround each and every side of the operation area S, in a plan view. However, the trenches do not necessarily need to be continuously formed over an entire periphery surrounding the operation area.

It is assumed in the above-described example that the GaN layer 13 is formed as the top portion in the semiconductor substrate 10, and that a semiconductor element is formed in the GaN layer 13. However, it is obvious that the above-described configuration according to the present invention is effective regardless of a structure of the semiconductor substrate. In this respect, the configuration is particularly effective when a layer in which chipping and a crack easily occur is present in the semiconductor substrate. That is, the configuration is particularly effective when the semiconductor substrate includes a layer composed of a compound semiconductor (including a group-III nitride semiconductor).

What is claimed is:

1. A semiconductor device having a protective layer formed on a semiconductor substrate, the protective layer including a silicon nitride layer and an organic film layer in a stack structure,
wherein:
the organic film layer is formed on the silicon nitride layer, with a larger thickness than that of the silicon nitride layer;
the organic film layer is formed such that, in a plan view, an edge of the organic film layer is located inside an area in which the silicon nitride layer is formed, on the semiconductor substrate; and
a distance between the edge of the organic film layer and an edge of the silicon nitride layer, in a plan view, is set to be no smaller than 10 μm and no larger than 200 μm.

2. The semiconductor device according to claim 1,
wherein the silicon nitride layer is formed such that, in a plan view, the edge of the silicon nitride layer is located inside an edge of the semiconductor substrate, and
wherein a distance between the edge of the silicon nitride layer and the edge of the semiconductor substrate, in a plan view, is set to be no smaller than 50 μm and no larger than 200 μm.

3. The semiconductor device according to claim 1, wherein an oxide layer is formed on the semiconductor substrate, and the silicon nitride layer is formed on the silicon oxide layer.

4. The semiconductor device according to claim 3, wherein a TEOS oxide layer is formed on the semiconductor substrate, and the silicon nitride layer is formed on the TEOS oxide layer.

5. The semiconductor device according to claim 1, wherein the organic film layer is composed of polyimide.

6. The semiconductor device according to claim 1, wherein the semiconductor substrate includes a stack structure including a layer composed of a group-III nitride semiconductor.

7. A semiconductor device having a protective layer formed on a semiconductor substrate, the protective layer including a silicon nitride layer and an organic film layer in a stack structure,
wherein:

the organic film layer is formed on the silicon nitride layer, with a larger thickness than that of the silicon nitride layer; and the organic film layer is formed such that, in a plan view, an edge of the organic film layer is located inside an area in which the silicon nitride layer is formed, on the semiconductor substrate; and on a side which is opposite, with reference to the edge of the silicon nitride layer in a plan view, to a side where the edge of the semiconductor substrate is located, a trench extending along an end portion of the silicon nitride layer and dug down from the top surface of the semiconductor substrate is formed in the semiconductor substrate.

8. The semiconductor device according to claim 7, wherein the trench is formed as a plurality of trenches in a row extending from the side of the edge of the silicon nitride layer in a direction toward a side opposite to the side where the edge of the semiconductor substrate is located.

9. The semiconductor device according to claim 8, wherein the trenches are formed to be smaller in both width and depth with increasing distance from the edge of the silicon nitride layer in the direction toward the side opposite to the side where the end portion of the semiconductor substrate is located.

\* \* \* \* \*